(12) United States Patent
Saenger (10) Patent No.: US 8,917,433 B2
(45) Date of Patent: Dec. 23, 2014

(54) OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventor: Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/103,150

(22) Filed: Dec. 11, 2013

(65) Prior Publication Data

US 2014/0168739 A1 Jun. 19, 2014

Related U.S. Application Data

(60) Provisional application No. 61/737,156, filed on Dec. 14, 2012.

(30) Foreign Application Priority Data

Dec. 14, 2012 (DE) .......................... 10 2012 223 217

(51) Int. Cl.
*G02B 26/08* (2006.01)
*G03F 7/20* (2006.01)
*G02B 27/28* (2006.01)

(52) U.S. Cl.
CPC .............. *G02B 26/0833* (2013.01); *G03F 7/20* (2013.01); *G02B 27/28* (2013.01)
USPC ..................................... 359/223.1

(58) Field of Classification Search
CPC .. G02B 27/283; G02B 17/08; G02B 26/0833; G02B 26/0841; G02B 26/0816
USPC ............... 359/485.07, 223.1–226.1, 290, 291
See application file for complete search history.

(56) References Cited

U.S. PATENT DOCUMENTS 6,191,880 B1 2/2001 Schuster
7,525,642 B2 4/2009 Mulder et al.
(Continued)

FOREIGN PATENT DOCUMENTS

DE 10 2004 011 733 A1 9/2005
DE 10 2008 009 601 A1 8/2009
(Continued)

OTHER PUBLICATIONS

Japanese Office Action, with translation thereof, for JP Appl No. 2013-257673, dated Apr. 11, 2014.

(Continued)

*Primary Examiner* — Euncha Cherry (74) *Attorney, Agent, or Firm* — Fish & Richardson P.C.

(57) ABSTRACT

The invention relates to an optical system of a microlithographic projection exposure apparatus, comprising a mirror arrangement having a plurality of mirror elements which are adjustable independently of one another for the purpose of changing an angular distribution of the light reflected by the mirror arrangement, a polarization-influencing optical arrangement having at least one polarization-influencing component, wherein, by displacing the polarization-influencing component, a degree of overlap between the polarization-influencing component and the mirror arrangement can be set in a variable manner, and a deflection device having a respective reflection surface upstream and downstream of the mirror arrangement relative to the light propagation direction.

20 Claims, 7 Drawing Sheets

(56) References Cited

U.S. PATENT DOCUMENTS

| | | |
|---|---|---|
| 8,144,308 B2 | 3/2012 | Muramatsu |
| 8,379,187 B2 | 2/2013 | Tanitsu |
| 8,792,081 B2 * | 7/2014 | Owa .............................. 355/67 |
| 2007/0146676 A1 | 6/2007 | Tanitsu et al. |
| 2007/0195305 A1 | 8/2007 | Mulder et al. |
| 2007/0279613 A1 | 12/2007 | Fiolka et al. |
| 2009/0117494 A1 | 5/2009 | Owa |
| 2011/0037962 A1 | 2/2011 | Tanitsu |
| 2011/0063597 A1 | 3/2011 | Mengel |
| 2011/0228247 A1 | 9/2011 | Mulder et al. |
| 2012/0202157 A1 | 8/2012 | Tanitsu |
| 2013/0050673 A1 | 2/2013 | Saenger et al. |
| 2013/0077077 A1 | 3/2013 | Saenger et al. |

FOREIGN PATENT DOCUMENTS

| | | |
|---|---|---|
| DE | 10 2010 029 905 | 12/2011 |
| DE | 10 2012 206 154 | 6/2013 |
| JP | 2007-227918 | 9/2007 |
| JP | 2009-105396 | 5/2009 |
| JP | 2009-117671 | 5/2009 |
| JP | 2011-199285 | 10/2011 |
| TW | 200734800 A | 9/2007 |
| TW | 201015240 A1 | 4/2010 |
| TW | 201211700 A1 | 3/2012 |
| WO | WO 2005/026843 | 3/2005 |
| WO | WO 2005/031467 | 4/2005 |
| WO | WO 2005/069081 A2 | 7/2005 |
| WO | WO 2008/019936 A2 | 2/2008 |
| WO | WO 2009/034109 | 3/2009 |
| WO | WO 2009/060745 | 5/2009 |
| WO | WO 2009/100862 A1 | 8/2009 |
| WO | WO 2010/041522 | 4/2010 |
| WO | WO 2011/154227 | 12/2011 |

OTHER PUBLICATIONS

Japanese Office Action, with translation thereof, for JP Appl No. 2013-257673, dated Aug. 4, 2014.

Taiwanese Office Action and Search Report, with translation thereof, for TW Appl No. 102146157, dated Sep. 26, 2014.

* cited by examiner

OPTICAL SYSTEM OF A MICROLITHOGRAPHIC PROJECTION EXPOSURE APPARATUS

CROSS-REFERENCE TO RELATED APPLICATIONS

This application claims priority under 35 U.S.C. §119(e)(1) to U.S. Provisional Application No. 61/737,156 filed Dec. 14, 2012. This application also benefit under 35 U.S.C. §119 to German Application No. 10 2012 223 217.6, filed Dec. 14, 2012. The contents of both of these applications are hereby incorporated by reference in its entirety

FIELD

The invention relates to an optical system of a microlithographic projection exposure apparatus.

BACKGROUND

Microlithography is used for producing microstructured components, such as, for example, integrated circuits or LCDs. The microlithography process is carried out in a so-called projection exposure apparatus comprising an illumination device and a projection lens. In this case, the image of a mask (=reticle) illuminated via the illumination device is projected, via the projection lens, onto a substrate (e.g. a silicon wafer) coated with a light-sensitive layer (photoresist) and arranged in the image plane of the projection lens, in order to transfer the mask structure to the light-sensitive coating of the substrate.

During the operation of a microlithographic projection exposure apparatus there is a need to set defined illumination settings, i.e. intensity distributions in a pupil plane of the illumination device, in a targeted manner. For this purpose, besides the use of diffractive optical elements (so-called DOEs), the use of mirror arrangements is also known, e.g. from WO 2005/026843 A2. Such mirror arrangements comprise a multiplicity of micromirrors that can be set independently of one another.

Furthermore, various approaches are known for setting, in the illumination device, for the purpose of optimizing the imaging contrast, specific polarization distributions in the pupil plane and/or in the reticle in a targeted manner. In particular, it is known, both in the illumination device and in the projection lens, to set a tangential polarization distribution for high-contrast imaging. "Tangential polarization" (or "TE polarization") is understood to mean a polarization distribution in which the planes of vibration of the electrical field strength vectors of the individual linearly polarized light rays are oriented approximately perpendicularly to the radius directed toward the optical system axis. By contrast, "radial polarization" or ("TM polarization") is understood to mean a polarization distribution in which the planes of vibration of the electrical field strength vectors of the individual linearly polarized light rays are oriented approximately radially with respect to the optical system axis.

With regard to the prior art, reference is made for example to WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, DE 10 2008 009 601 A1, DE 10 2004 011 733 A1, DE 10 2010 029 905 A1 and US 2011/0228247 A1.

SUMMARY

One possible approach for flexibly setting the polarization distribution in this case comprises the use of a polarization-influencing optical arrangement composed of a plurality of polarization-influencing components arranged such that they are displaceable transversely with respect to the light propagation direction in combination with a mirror arrangement comprising a multiplicity of mirror elements that are adjustable independently of one another. In this case, depending on the degree of coverage of the mirror arrangement by the polarization-influencing components in conjunction with a likewise variable setting of the mirror elements of the mirror arrangement, it is possible to realize different polarization distributions in the pupil plane of the illumination device in a flexible manner.

It is an object of the present invention to provide an optical system of a microlithographic projection exposure apparatus which makes it possible to flexibly set different polarized illumination settings with comparatively little structural outlay and, in particular, also as an extension or retrofit of existing systems.

This object is achieved in accordance with an optical system of a microlithographic projection exposure apparatus, which comprises a mirror arrangement having a plurality of mirror elements which are adjustable independently of one another for the purpose of changing an angular distribution of the light reflected by the mirror arrangement. The optical system also includes a polarization-influencing optical arrangement having at least one polarization-influencing component, wherein, by displacing the polarization-influencing component, a degree of overlap between the polarization-influencing component and the mirror arrangement can be set in a variable manner. The optical system further comprises a deflection device having a respective reflection surface upstream and downstream of the mirror arrangement relative to the light propagation direction.

An optical system according to the invention of a microlithographic projection exposure apparatus comprises:

a mirror arrangement having a plurality of mirror elements which are adjustable independently of one another for the purpose of changing an angular distribution of the light reflected by the mirror arrangement;

a polarization-influencing optical arrangement having at least one polarization-influencing component, wherein, by displacing the polarization-influencing component, a degree of overlap between the polarization-influencing component and the mirror arrangement can be set in a variable manner; and a deflection device having a respective reflection surface upstream and downstream of the mirror arrangement relative to the light propagation direction.

The invention is based on the concept, in particular, of providing, in an optical system which, for the purpose of flexibly setting different polarization distributions, has a mirror arrangement having mutually independently adjustable mirror elements and a polarization-influencing optical arrangement having at least one polarization-influencing component which can be set in a variable manner with regard to its degree of overlap with the mirror arrangement, a deflection device having a respective reflection surface both upstream and downstream of the mirror arrangement relative to the light propagation direction. This makes it possible to use the combination—serving for flexibly setting different polarization states—of mirror arrangement and at least one polarization-influencing component together with the deflection device in the manner of a module (to an extent comparable with the "plug-and-play" principle) in a conventional illumination device equipped e.g. with a diffractive optical element (DOE) for the purpose of setting a desired illumination setting, by replacing the DOE, since the illumination light is coupled out from the optical beam path and coupled into the optical beam path again in a simple manner via the deflection device and without the requirement for further modifications in the rest of the optical design of the illumination device.

In other words, according to the invention, with complete compatibility with the available optical design of the respectively existing illumination device equipped e.g. with a DOE, the illumination device can be additionally equipped to the effect that in addition differently polarized illumination settings can be flexibly set by replacing the DOE by the module according to the invention. The above-described coupling of the illumination light in and out is furthermore advantageous in so far as, if appropriate, optimum utilization of the available structural space is thereby made possible.

In accordance with one embodiment, the deflection device (i.e. the reflection surface arranged upstream of the mirror arrangement and/or the reflection surface arranged downstream of the mirror arrangement), on account of different reflectances for s- and p-polarized light, for incident light, brings about an effective polarization rotation $R_{sp}$ which is taken into account or made available in the design of the polarization-influencing optical arrangement in so far as the polarization rotation R required for generating a desired polarization distribution in the optical system results from $$R = R_{Pol} + R_{sp},$$

where $R_{pol}$ designates the polarization rotation generated by the polarization-influencing optical arrangement.

This embodiment takes account of the circumstance that, during the operation of the optical system according to the invention, light reflected at the deflection device (i.e. at the "second" reflection surface of the deflection device, i.e. the reflection surface arranged downstream of the mirror arrangement, and/or already at the first reflection surface, arranged upstream of the mirror arrangement), on account of different reflectances for s- and p-polarization, effectively experiences an additional (and thus initially undesirable) polarization rotation provided that the light is not incident on the reflection surface in the eigen state (i.e. either fully s-polarized or fully p-polarized).

This initially undesirable additional polarization rotation can be attributed to the fact that for light not incident on the relevant reflection surface of the deflection device in the eigen state, according to Fresnel's formulae, the p-polarized component is attenuated to a greater extent relative to the s-polarized component (also designated as "s-p splitting"), which has the consequence that the light reflected at the relevant reflection surface has on the one hand an intensity attenuation and on the other hand a comparatively greater proportion of the s-polarized component and thus an effectively rotated direction of the (still linear) polarization. As a result, the accompanying deviation of the polarization state ultimately generated in the illumination device from the desired polarization state can lead to an impairment of the performance of the projection exposure apparatus on account of imaging aberrations and a loss of contrast.

Proceeding from this insight, the invention is then based, in particular, on the further concept of the above-described initially undesirable polarization rotation at the second and/or first reflection surface of the deflection device being taken into account or "kept available" in the optical system by virtue of the polarization-influencing effect of the at least one polarization-influencing component already being correspondingly designed from the outset with the polarization rotation being taken into account. In other words, the polarization-influencing arrangement or the component(s) thereof is (are) configured with regard to the polarization-influencing effect thereof in such a way that the ultimately desired polarization setting does not arise directly as early as after the polarization-influencing optical arrangement, but rather only in combination with the above-described polarization-influencing effect of the second deflection device.

As described below, the polarization-influencing effect of the at least one polarization-influencing component used in the optical system according to the invention can be implemented in particular using optical activity (for instance with the configuration of the polarization-influencing component(s) made from optically active crystalline quartz) or using linear birefringents (in particular with the configuration of the polarization-influencing component(s) as lambda/4 plate(s) or as lambda/2 plate(s), in each case with suitable orientation of the fast axis of birefringents). In this context, the realization of the above-described concept according to the invention of taking account of the polarization rotation occurring at the second and/or at the first reflection surface of the deflection device mechanism, then, that either—namely in the case of using the optical activity—a corresponding thickness adaptation of the polarization-influencing component(s) or—when using the linear birefringents e.g. of a lambda/4 plate or lambda/2 plate—a suitable change in the orientation of the fast axis of birefringents in the relevant polarization-influencing components is effected.

The configuration of the polarization-influencing component(s) as lambda/4 plate(s) is advantageous for light passing through twice (as described in even greater detail below), whereas the configuration of the polarization-influencing component(s) as lambda/2 plate(s) is preferred for light passing once through the relevant component(s).

In one concrete example it is possible, for instance, instead of each of a total of three polarization-influencing components being configured with a polarization rotation angle of 45° for flexibly generating correspondingly "quantized" polarization states, for the first of the components to be configured with a polarization rotation angle of more than 45° ($45°+\gamma_1$), the second of the components to be configured with a polarization rotation angle of less than 45° ($45°-\gamma_2$) and for the third of the components likewise to be configured with a polarization rotation angle of less than 45° ($45°-\gamma_3$). While the "detuning" of the first component compensates for the above-discussed undesirable polarization rotation at the second reflection surface of the deflection device (namely to the effect that the polarization rotation angle desired in the example is achieved only in combination with the s-p splitting), it emerges upon the overlap of the first and second polarization-influencing components in particular in the case $\gamma_1 = \gamma_2 > 0$ for those light rays which pass through both the first and the second component that the light rays are incident on the second reflection surface of the deflection device with a polarization direction rotated by 90° and thus e.g. (depending on the original polarization direction) in the eigen state, such that no polarization rotation on account of "s-p splitting" arises here. As a further special case, $\gamma_1 = \gamma_2 = \gamma_3 > 0$ can be chosen with regard to the possible overlap of three polarization-influencing components.

In accordance with one embodiment, the polarization-influencing optical arrangement has at least two, in particular at least three, polarization-influencing components. Consequently, the flexible setting of the polarization state can be effected not only by variation of the degree of overlap between a polarization-influencing component and the mirror arrangement, but also by variation of the degree of overlap between the plurality of polarization-influencing components among one another.

In this case, in particular, at least two of the polarization-influencing components can have different thicknesses, in order to bring about the above-described "detuning" of the polarization-influencing optical arrangement for taking account of the polarization rotation occurring at the deflection device.

In accordance with one embodiment, the at least one polarization-influencing component is produced from optically active crystal material, in particular crystalline quartz ($SiO_2$) having a crystal axis parallel to the light propagation direction.

In accordance with a further embodiment, the at least one polarization-influencing component is produced linearly by birefringent crystal material, in particular magnesium fluoride ($MgF_2$), sapphire ($Al_2O_3$) or crystalline quartz ($SiO_2$) having a crystal axis parallel to the light propagation direction. In this case, the at least one polarization-influencing component can be, in particular, a lambda/4 plate or a lambda/2 plate.

Furthermore, the at least one polarization-influencing component can be displaceable between a position within the optical beam path and a position outside the optical beam path, wherein (in particular in the case of configuration as a lambda/4 plate) incident light passes twice through the polarization-influencing component in the position thereof within the optical beam path during the operation of the optical system.

In accordance with one embodiment, the deflection device is embodied as a prism, wherein the reflection surfaces are formed by interfaces of the prism.

In accordance with a further embodiment, the deflection device is embodied in such a way that at least one of the reflection surfaces reflects incident light during the operation of the optical system with total internal reflection.

In accordance with one embodiment, the deflection device has two deflection mirrors.

In accordance with one embodiment, the optical system, upstream of the polarization-influencing optical arrangement in the light propagation direction, has a further mirror arrangement having a plurality of mirror elements which are adjustable independently of one another for the purpose of changing an angular distribution of the light reflected by the mirror arrangement. In this case, in particular, the mirror elements of the further mirror arrangement jointly form the first reflection surface.

In accordance with one embodiment, the optical system is designed for an operating wavelength of less than 250 nm, in particular less than 200 nm, more particularly less than 160 nm.

The invention furthermore relates to a microlithographic projection exposure apparatus comprising an illumination device and a projection lens, wherein the illumination device comprises an optical system having the features described above.

Further configurations of the invention can be gathered from the following description and the dependent claims.

The invention is explained in greater detail below on the basis of preferred exemplary embodiments and with reference to the accompanying figures.

DETAILED DESCRIPTION

Hereinafter, a basic construction of a microlithographic projection exposure apparatus comprising an optical system according to the invention will firstly be explained with reference to FIG. 7. The projection exposure apparatus comprises an illumination device 10 and a projection lens 20. The illumination device 10 serves for illuminating a structure-bearing mask (reticle) 30 with light from a light source unit 1, which comprises, for example, an ArF excimer laser for an operating wavelength of 193 nm and a beam shaping optical unit, which generates a parallel light beam. Generally, the illumination device 10 and the projection lens 20 are preferably designed for an operating wavelength of less than 400 nm, in particular less than 250 nm, more particularly less than 200 nm.

According to the invention, part of the illumination device 10 is, in particular, a mirror arrangement 200 having a multiplicity of mirror elements which can be set independently of one another. A polarization-influencing optical arrangement 100, which will be explained in even greater detail below with reference to FIG. 1 et seq., is arranged upstream of the mirror arrangement 200 in the light propagation direction. The polarization-influencing optical arrangement 100 can alternatively also be arranged downstream of the mirror arrangement 200 in the light propagation direction, as likewise explained in even greater detail below.

Figure 7:
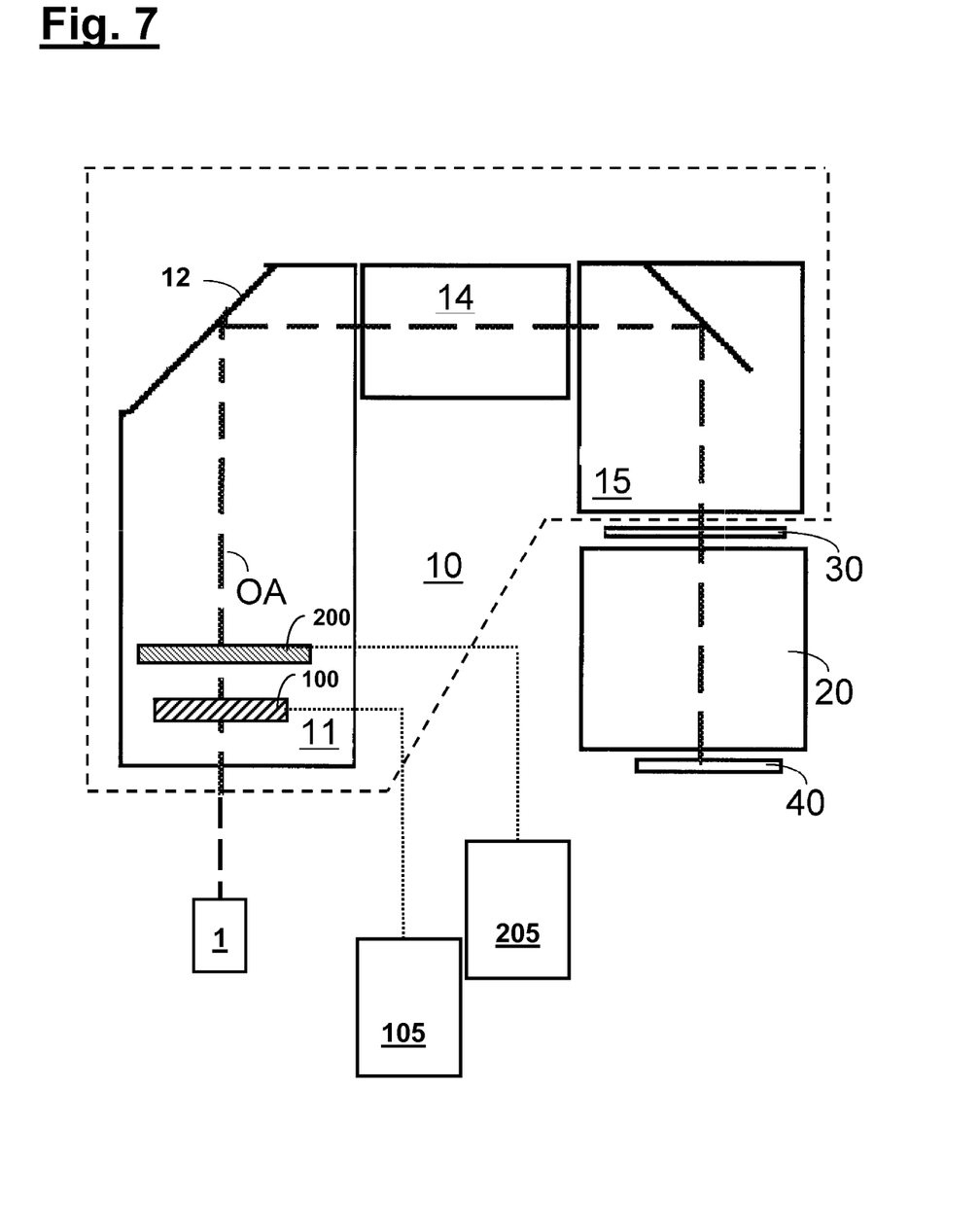
FIG. 7 shows a schematic illustration of the construction of a microlithographic projection exposure apparatus in which the present invention can be realized.

In accordance with FIG. 7, driving units 105, 205 are furthermore provided, which are assigned to the polarization-influencing optical arrangement 100 and to the mirror arrangement 200, respectively, and respectively enable the arrangements to be adjusted via suitable actuators. Actuators for adjusting the arrangements 100, 200 can be configured, merely by way of example, electrostatically (via so-called comb electrodes) or else in any other suitable manner.

The illumination device 10 has an optical unit 11, which comprises a deflection mirror 12 inter alia in the example illustrated. Downstream of the optical unit 11 in the light propagation direction there are situated in the beam path a light mixing device (not illustrated), which can have, for example, in a manner known per se, an arrangement of micro-optical elements suitable for achieving light mixing, and a lens element group 14, downstream of which is situated a field plane with a reticle masking system (REMA), which is imaged, by a REMA lens 15 disposed downstream in the light propagation direction, onto the structure-bearing mask (reticle) 30 arranged in a further field plane and thereby delimits the illuminated region on the reticle. The structure-bearing mask 30 is imaged by the projection lens 20 onto a substrate 40, or a wafer, provided with a light-sensitive layer. The projection lens 20 can be designed, in particular, for immersion operation. Furthermore, it can have a numerical aperture NA of greater than 0.85, in particular greater than 1.1.

The mirror arrangement 200 has, as indicated in each case in FIGS. 1-6, a plurality of mirror elements 200a, 200b, 200c, . . . . Such a mirror arrangement is occasionally also designated as MMA ("micro mirror array") or else as spatial light modulator. The mirror elements 200a, 200b, 200c, . . . are adjustable independently of one another for the purpose of changing an angular distribution of the light reflected by the mirror arrangement 200, the driving unit 205 serving for this purpose in accordance with FIG. 1. Upstream of the mirror arrangement 200 in the light propagation direction, in the exemplary embodiment, there is also situated an indicated microlens element arrangement, which is not shown in FIG. 1 and which has a multiplicity of microlens elements for targeted focusing onto the mirror elements of the mirror arrangement in order to avoid loss of light and generation of stray light in the regions between the individual mirrors (as a result of spillover radiation of the individual mirrors). The mirror elements 200a, 200b, 200c, . . . can each be tilted individually, e.g. in an angular range of −2° to +2°, in particular −5° to +5°, more particularly −10° to +10°. Via a suitable tilting arrangement of the mirror elements 200a, 200b, 200c, . . . in the mirror arrangement 200, a desired light distribution, e.g. an annular illumination setting or else a dipole setting or a quadrupole setting, can be formed in a pupil plane of the illumination device 10 from FIG. 7 by virtue of the previously homogenized and collimated laser light in each case being directed in the corresponding direction depending on the desired illumination setting via the mirror elements 200a, 200b, 200c, . . . of the mirror arrangement 200.

Firstly the interaction of the polarization-influencing optical arrangement 100, already mentioned in connection with FIG. 7, with the mirror arrangement 200 is elucidated below with reference to FIG. 1.

Figure 1:
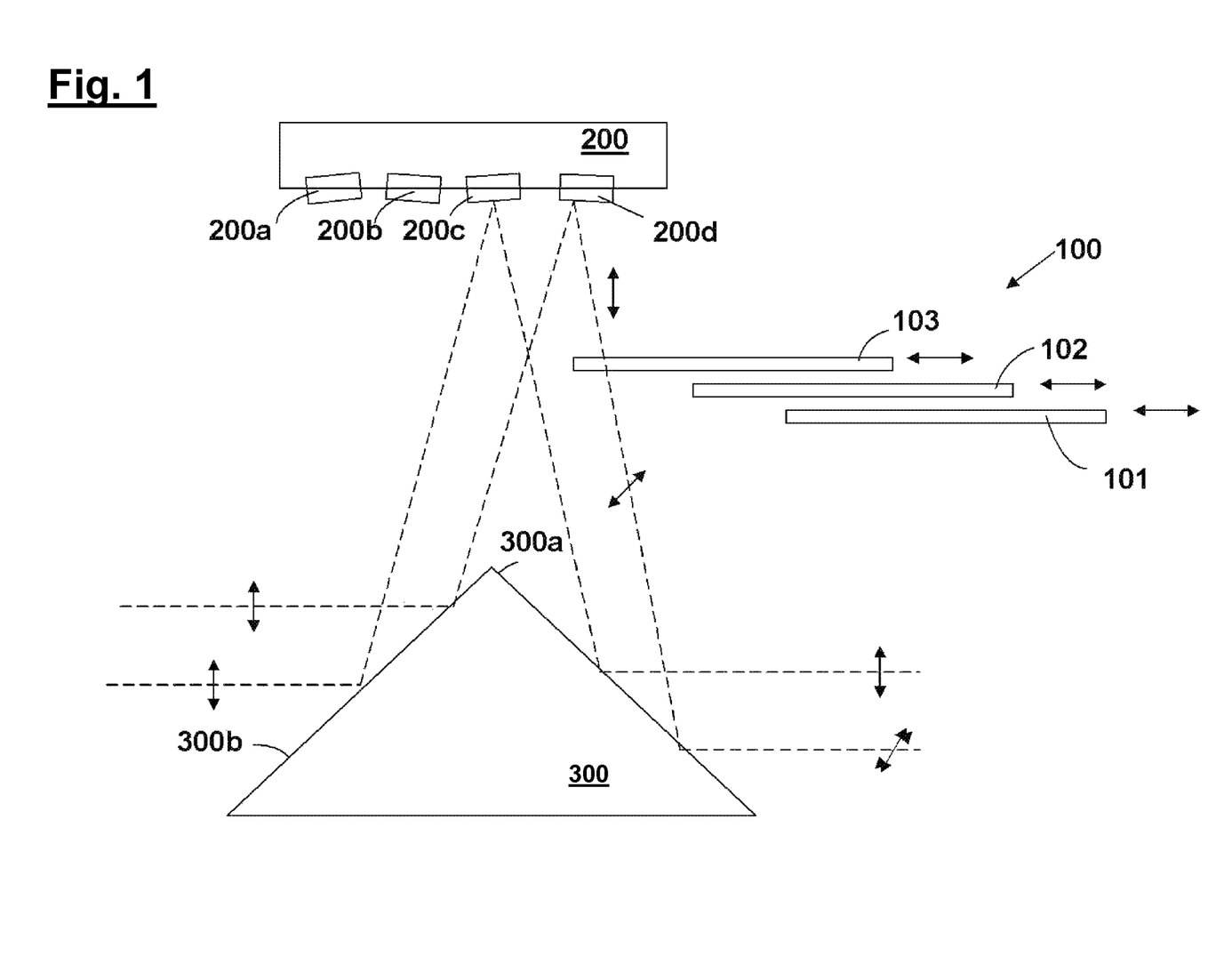
FIGS. 1-6 show schematic illustrations for elucidating possible embodiments of an optical system according to the invention for flexibly setting different polarization states.

In the exemplary embodiment in FIG. 1, the polarization-influencing optical arrangement 100 has (without the invention being restricted thereto) three polarization-influencing components 101-103 which are adjustable independently of one another, can be introduced into the beam path in each case perpendicularly to the light propagation direction and, in the exemplary embodiment in FIG. 1, are embodied in each case in the form of optical rotators composed of optically active crystalline quartz, wherein each of the rotators, for light passing through, brings about by itself a rotation of the preferred direction of polarization by a specific angle $\alpha_1$, $\alpha_2$ and $\alpha_3$, respectively.

Depending on the degree of coverage of the mirror arrangement 200 by the polarization-influencing components 101, 102, 103 in conjunction with the variable setting of the mirror elements 200a, 200b, 200c, . . . of the mirror arrangement 200 (the number of which is typically significantly higher than illustrated and can, in particular, also be one hundred or more), different polarization distributions in the pupil plane of the illumination device can be realized in a flexible manner with the construction from FIG. 1. Via the microlens element arrangement (not illustrated), the individual partial beams can be respectively focused onto the individual mirror elements 200a, 200b, 200c, . . . of the mirror arrangement 200, wherein such a microlens element arrangement can alternatively be arranged upstream or else downstream of the polarization-influencing optical arrangement 100 in the light propagation direction.

Consequently, merely by way of example, the preferred direction of polarization is rotated by an angle $\alpha_1$ upon light passing through only the rotator 101, by an angle $\alpha_1+\alpha_2$ when light passes through the rotators 101 and 102, and by an angle $\alpha_1+\alpha_2+\alpha_3$ when light passes through all the rotators 101-103. The double-headed arrows depicted in FIG. 1 for the respective partial beams in each case denote the preferred direction of polarization of the partial beams at the relevant location.

In accordance with FIG. 1, a deflection device 300 in the form of prism is furthermore provided, wherein the deflection device 300 has a respective reflection surface 300a, 300b upstream and downstream of the mirror arrangement 200 relative to the light propagation direction. As is evident from FIG. 1, the deflection device 300 brings about a folding of the optical beam path to the effect that light which is incident on the first reflection surface 300a of the deflection device 300 during the operation of the illumination device is deflected firstly substantially perpendicularly to the original propagation direction (i.e. propagation direction present before incidence on the first reflection surface 300a), whereupon the light, depending on the insertion position of the polarization-influencing components 101, 102 and 103 of the arrangement 100 firstly passes through the relevant component(s) 101, 102 and/or 103, is subsequently incident on the mirror arrangement 200 and is incident on the second reflection surface 300b depending on the position of the mirror elements 200a-200d. The second reflection surface 300b in turn brings about a deflection in the original propagation direction (i.e. propagation direction provided before incidence on the first reflection surface 300a).

The deflection device 300 thus makes it possible to use the entire group—shown in FIG. 1—comprising polarization-influencing optical arrangement 100, mirror arrangement 200 and deflection device 300 for instance instead of a diffractive optical element (DOE) provided in an existing illumination device, without making further modifications to the optical beam path or to the design of the illumination device, since the light is to an extent temporarily deflected out of the original beam path for the purpose of setting a desired polarized illumination setting.

In this case, the undesirable polarization rotation—described in the introduction—e.g. at the second reflection surface 300b of the deflection device 300, on account of the different reflectances for s- and p-polarized light (i.e. the "s-p splitting"), is taken into account or "kept available" in the optical system by virtue of the fact that the polarization-influencing effect of the polarization-influencing components 101, 102, 103 of the arrangement 100 is already correspondingly designed from the outset with the polarization rotation being taken into account. In other words, the polarization-influencing arrangement 100 is configured with regard to the polarization-influencing effect thereof in such a way that the ultimately desired polarization setting does not arise directly as early as after the polarization-influencing optical arrangement 100, but rather only in combination with the above-described polarization-influencing effect of the deflection device 300.

Figure 2:
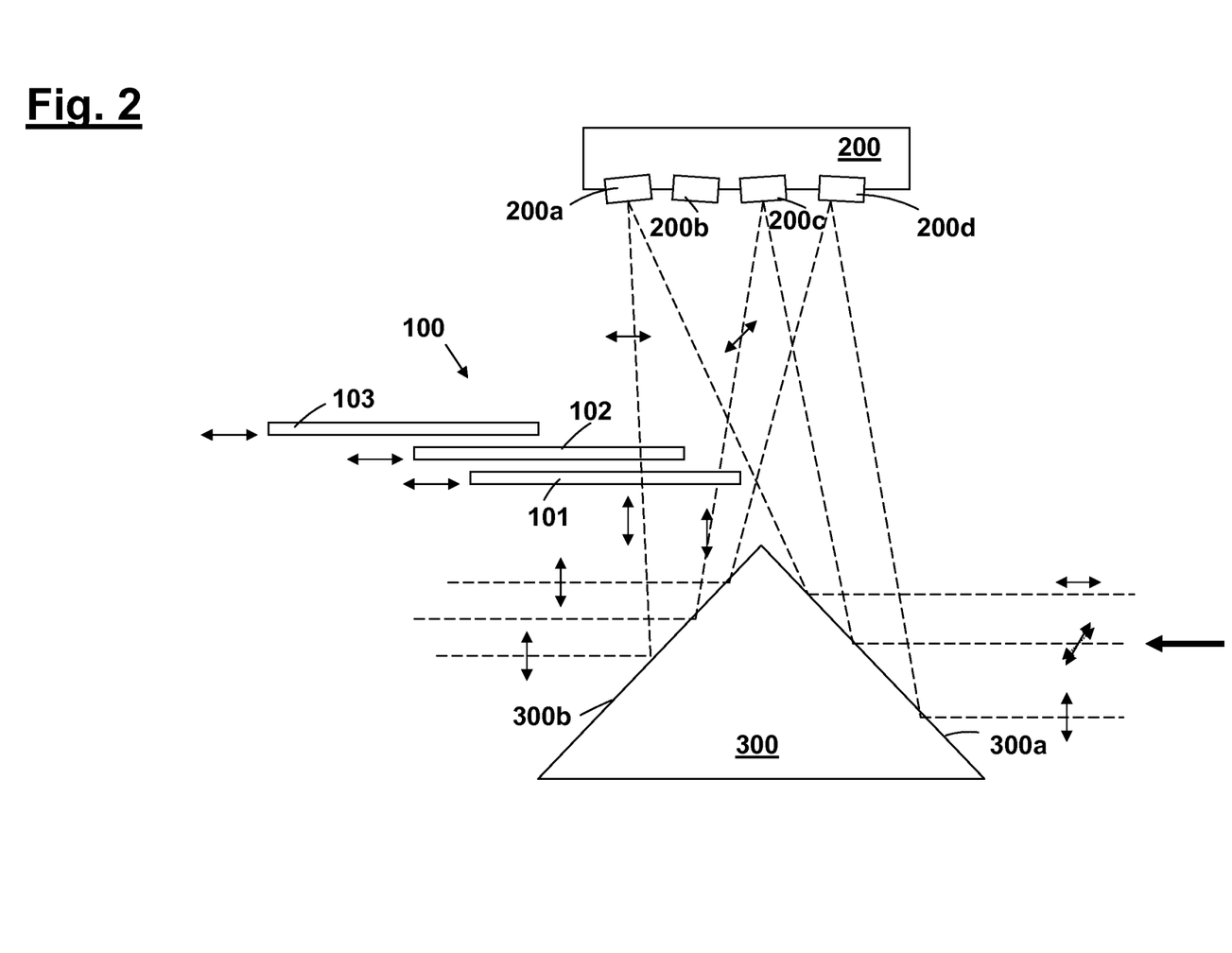

FIG. 2 shows merely schematically a further embodiment of the invention, which differs from that from FIG. 1 merely in that the polarization-influencing optical arrangement 100 is arranged downstream of the mirror arrangement 200 relative to the light propagation direction. The positioning of the polarization-influencing optical arrangement 100 relative to the mirror arrangement 200 is preferably effected in each case in such a way that the beam paths of the light rays leading to the individual mirror elements 200a, 200b, 200c, 200d, . . . or emerging therefrom, in the region of the polarization-influencing optical arrangement 100, are still separate from one another or do not yet overlap one another.

Figure 3:
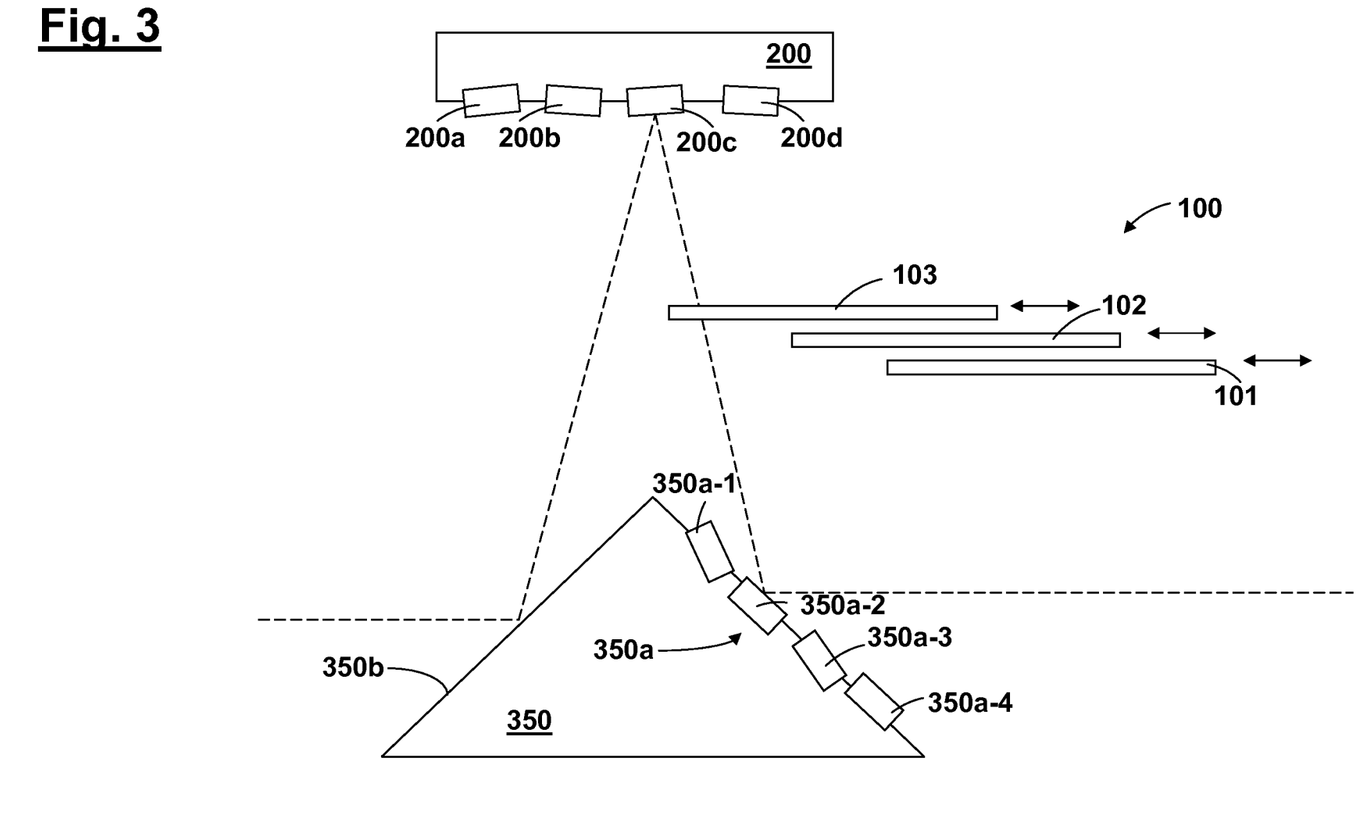

In accordance with a further embodiment, illustrated schematically in FIG. 3, in addition to the mirror arrangement 200 present in the embodiments described above, a further mirror arrangement comprising mirror elements 350a-1, 350a-2, 350a-3, 350a-4, . . . which can be set independently of one another can be provided, wherein the mirror elements 350a-1, . . . 350a-4, . . . jointly form the first reflection surface 350a of the deflection device 350. The independent setability of the mirror elements 350a-1, . . . , 350a-4, . . . enables a flexible addressing of the mirror elements 200a, 200b, 200c, 200d, . . . of the mirror arrangement 200 and thus a further increase in the flexibility provided overall when setting different polarized illumination settings.

The invention is not restricted to the configuration—provided in the embodiments described above—of the polarization-influencing optical arrangement 100 having three polarization-influencing components 101, 102 and 103. Rather, the polarization-influencing arrangement in further embodiments can also have fewer (i.e. only one or two) or else more polarization-influencing components.

Furthermore, the invention is not restricted to the configuration—provided in the embodiments described above—of the polarization-influencing components 101, 102 and 103 of the polarization-influencing optical arrangement 100 made from optically active crystal material. Rather, in further embodiments, the polarization-influencing components of the polarization-influencing optical arrangement can also be configured in a manner made from linearly birefringent material having sufficient transparency at the desired operating wavelength, for example from magnesium fluoride ($MgF_2$), sapphire ($Al_2O_3$) or else crystalline quartz having an orientation of the optical crystal axis that is perpendicular to the light propagation direction. Corresponding exemplary embodiments with the use of linear birefringents are shown in FIGS. 4 and 5.

Figure 4:
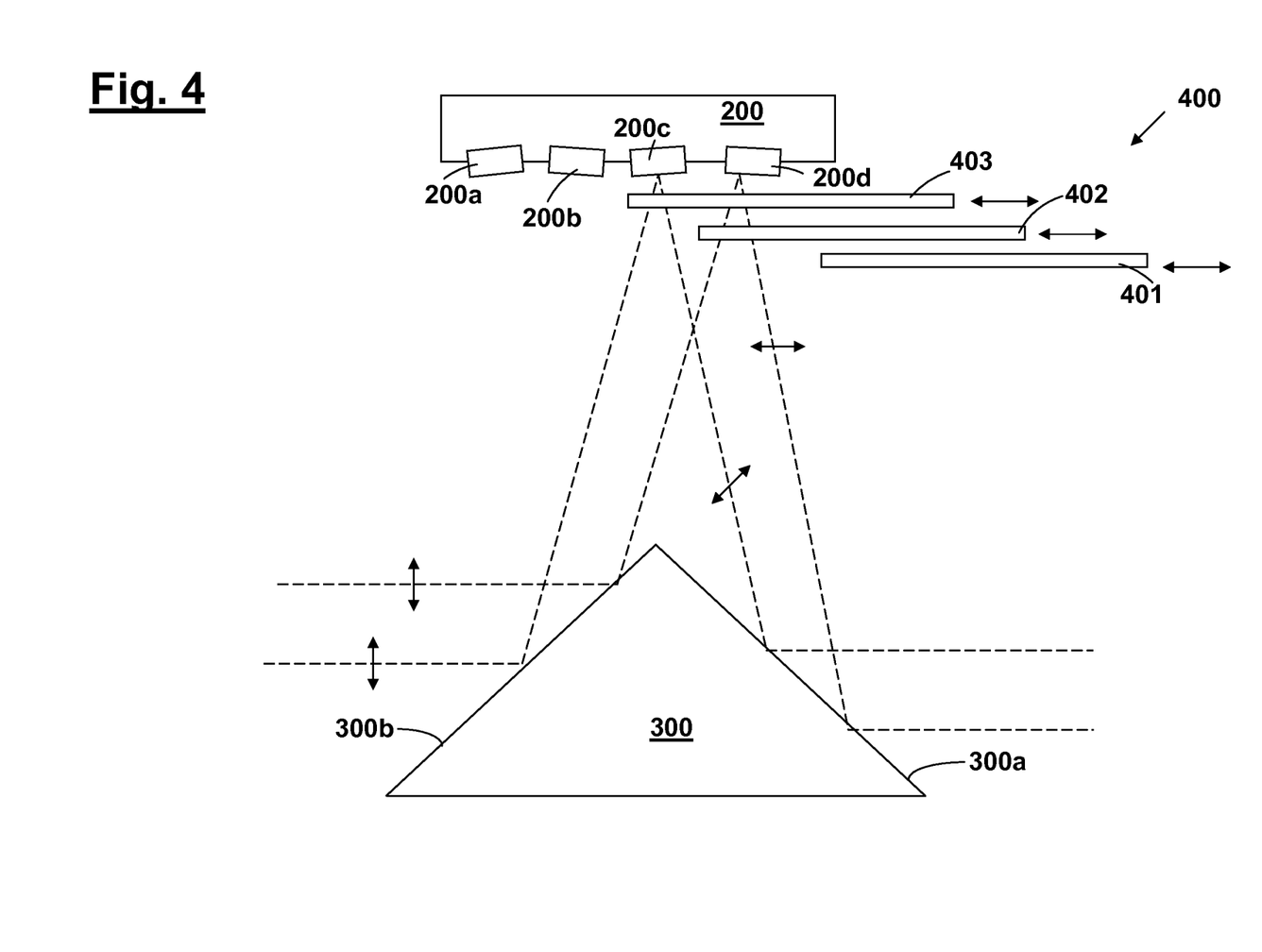
Figure 5:
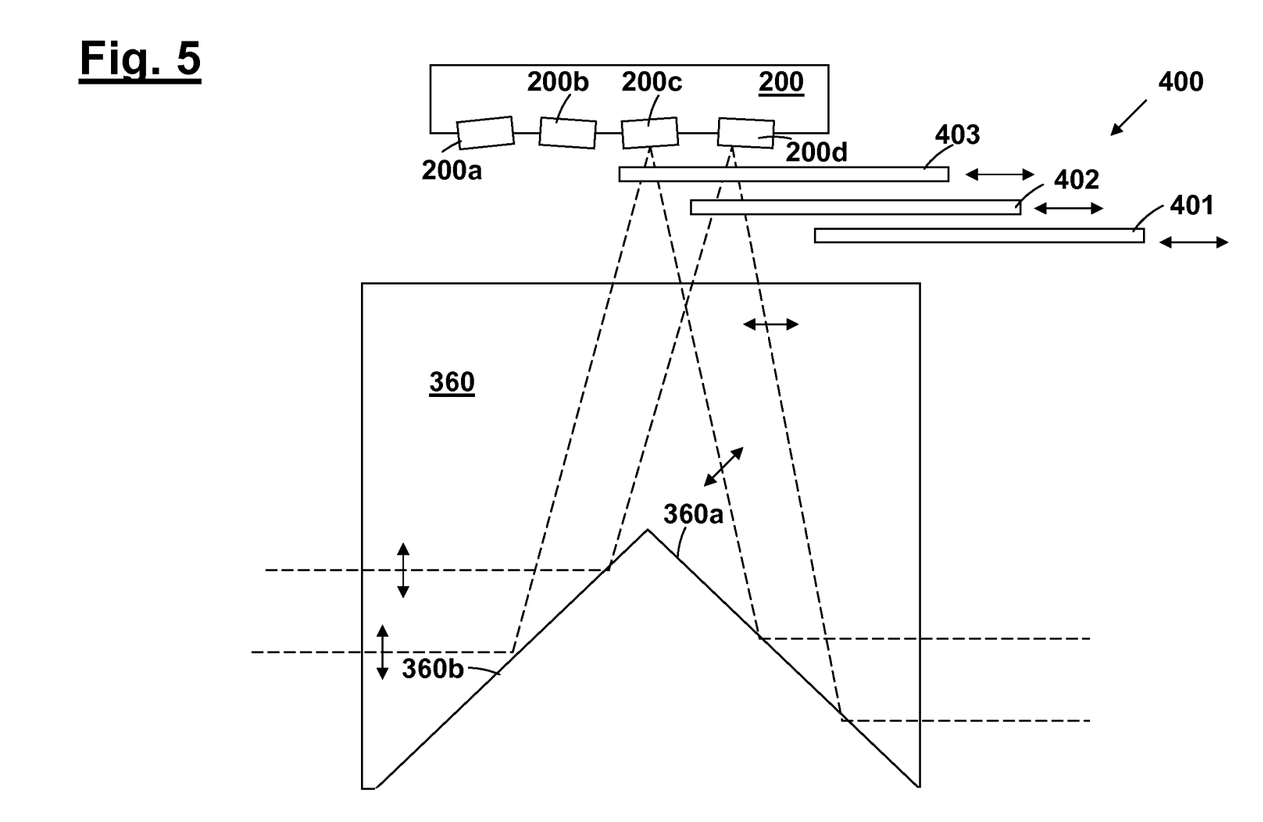

FIG. 4 firstly shows an exemplary embodiment in which the deflection device 300 is embodied as a prism analogously to the exemplary embodiments described above with reference to FIGS. 1-3, wherein, in contrast to FIGS. 1-3, the polarization-influencing components 401, 402 and 403 of the polarization-influencing optical arrangement 400 are configured as linearly birefringent components, to be precise in the concrete case as lambda/4 plates.

The polarization-influencing components 401, 402, 403 are—in this respect analogously to the embodiments described above with reference to FIGS. 1-3—displaceable perpendicularly to the light propagation direction in such a way that a degree of overlap between each polarization-influencing component 401, 402, 403 and the mirror arrangement 200 can be set in a variable manner via the respective displacement of the polarization-influencing components 401, 402, 403.

Furthermore, in accordance with FIG. 4, the polarization-influencing components 401, 402 and 403 are arranged in direct proximity to the mirror arrangement 200 in such a way that when a respective polarization-influencing component 401, 402 or 403 is positioned in the optical beam path, light passes through the relevant component 401, 402 or 403 twice, since it passes through the respective component not only before but also after reflection of the relevant light rays at the mirror arrangement 200.

This takes account of the circumstance that—unlike in the case of using the optical activity, in which case a corresponding arrangement with light once again passing through the component in the opposite direction would lead to a cancellation or "reversal" of the original polarization rotation brought about on account of the optical activity—the passing of light through a linearly birefringent component twice does not lead to a cancellation, but rather to a doubling of the polarization-influencing effect thereof. In the concrete exemplary embodiment in FIG. 4, this means that the polarization-influencing components 401, 402 and 403 designed in each case as a lambda/4 plate, with light passing through twice, act in each case as a lambda/2 plate, such that the respective polarization-influencing effect thereof corresponds to a mirroring of the polarization direction at the respective fast axis of birefringence.

In connection with the configuration of the polarization-influencing components 401-403 made from linearly birefringent material it should be taken into consideration, however, that, owing to a general lack of interchangeability of the components 401-403 acting as retarders, the above-described effect of a lambda/4 plate with light passing through twice as a lambda/2 plate holds true only for the case of a single polarization-influencing component 401, 402 or 403 (or the arrangement of only one of these components in the optical beam path), since, with the arrangement of two or more of the birefringent components in the optical beam path, it is necessary to take into account in each case the position of the fast axis of birefringence in the respectively preceding component(s).

In further embodiments, a configuration of the polarization-influencing components 401-403 made from lambda/2 plates can also be implemented, wherein in this case the lambda/2 plates are arranged in such a way that the illumination light passes through the relevant lambda/2 plate(s) only once. In the case of the configuration of the polarization-influencing component(s) as lambda/2 plate(s) with light passing through the relevant component(s) in each case once, the circumstance described in the previous paragraph does not pose a problem since only the polarization state set by the respective first lambda/2 plate has to be taken into account for polarization rotation by a second lambda/2 plate.

The above-described arrangement of the polarization-influencing components 401, 402 and 403 in direct proximity to the mirror arrangement 200 as made possible in the exemplary embodiment in FIG. 4 is advantageous in particular in so far as the mirror elements 200a, 200b, 200c, 200d, . . . of the mirror arrangement 200 can be addressed more exactly and an undesirable overlap of the beam paths between individual mirror elements can be better prevented.

The above-described positioning of the polarization-influencing components of the polarization-influencing optical arrangement in direct proximity to the mirror arrangement 200 is furthermore advantageous if, as described below, the deflection device is realized with the use of total internal reflection. Furthermore, structural space can also be saved when the polarization-influencing components of the polarization-influencing optical arrangement are positioned in direct proximity to the mirror arrangement 200.

FIG. 5 shows an exemplary embodiment which differs from that from FIG. 4 in that the deflection device 360 brings about the desired deflection of rays by total internal reflection twice at reflection surfaces 360a, 360b. For this purpose, the deflection device 360, which is produced in this exemplary embodiment as a prismatic body e.g. as quartz glass ($SiO_2$), has a light entrance surface perpendicular to the light propagation direction, wherein a light ray that has entered through the light entrance surface into the relatively "optically denser" material of the deflection device 360, before and after reflection at the mirror arrangement 200, is respectively subjected to total internal reflection by the reflection surfaces 360a, 360b before these light rays emerge again from the deflection device 360 with the original propagation direction through a light exit surface parallel to the light entrance surface.

The exemplary embodiment in FIG. 5, like that from FIG. 4, is realized in conjunction with a configuration of the polarization-influencing components 401, 402 and 403 of the polarization-influencing optical arrangement 100 made from linearly birefringent crystal, but can, of course, also be realized with the use of optical activity analogously to the exemplary embodiments in FIGS. 1-3.

Figure 6:
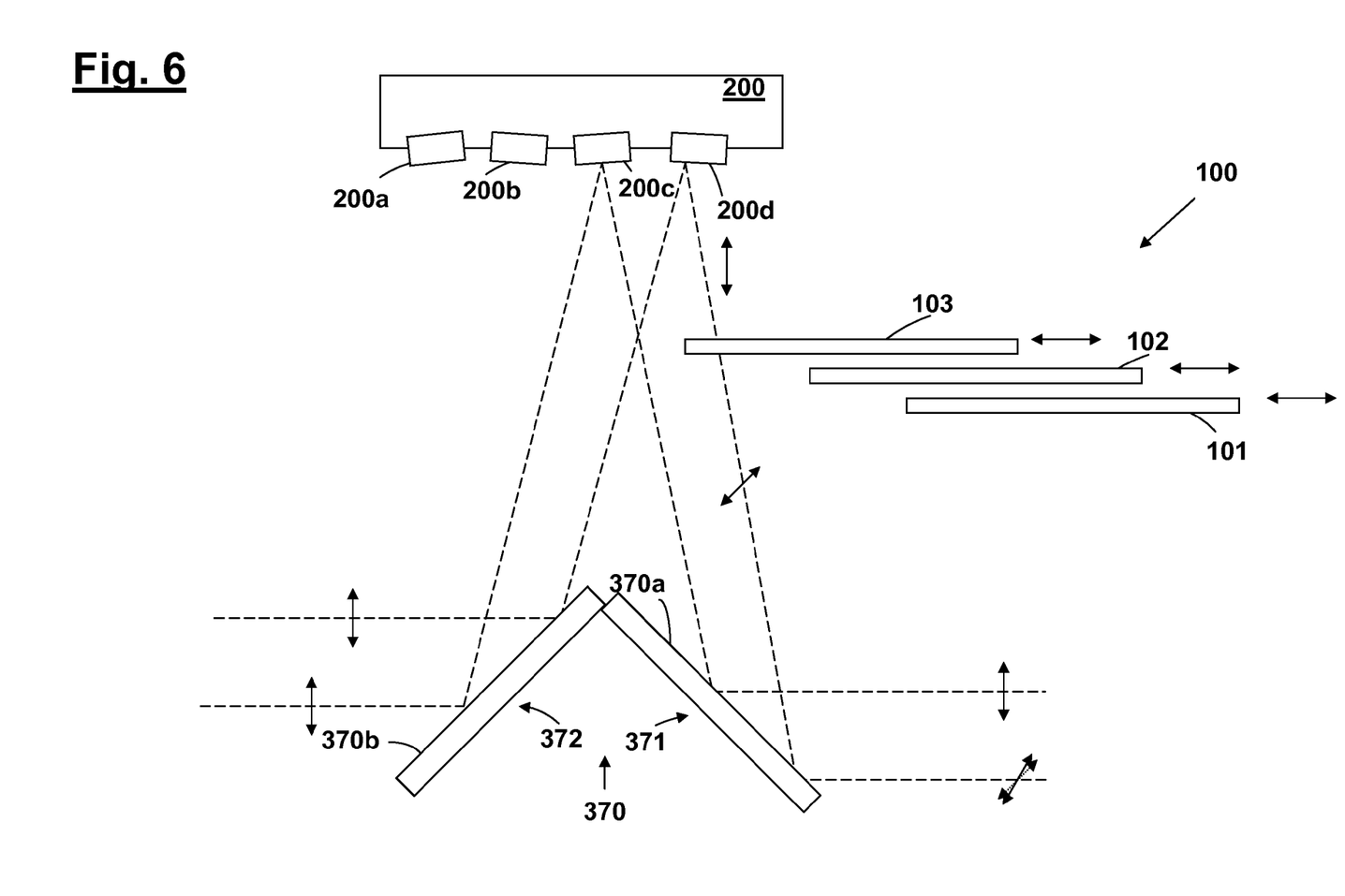

In a further exemplary embodiment illustrated schematically in FIG. 6, the deflection device 370 can also have two deflection mirrors 371, 372, which provide the reflection surfaces 370a, 370b required for respectively folding the beam path. This exemplary embodiment is once again realized in conjunction with a configuration of the polarization-influencing components 101, 102 and 103 of the polarization-influencing optical arrangement 100 made from optically active crystal material, but can, of course, also be realized with the use of linear birefringents analogously to the exemplary embodiments in FIGS. 4 and 5.

Even though the invention has been described on the basis of specific embodiments, numerous variations and alternative embodiments are evident to the person skilled in the art, e.g. by combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. An optical system, comprising:
    a mirror arrangement comprising a plurality of mirror elements which are adjustable independently of one another for the purpose of changing an angular distribution of the light reflected by the mirror arrangement;
    a polarization-influencing optical arrangement comprising at least one polarization-influencing component, wherein, by displacing the polarization-influencing component, a degree of overlap between the polarization-influencing component and the mirror arrangement is set in a variable manner; and
    a deflection device comprising a respective reflection surface upstream and downstream of the mirror arrangement relative to the light propagation direction,
    wherein the optical system is a microlithographic optical system.

2. The optical system according to claim 1, wherein the deflection device, on account of different reflectances for s- and p-polarized light, for incident light, brings about an effective polarization rotation $R_{sp}$ which is taken into account or made available in the design of the polarization-influencing optical arrangement in so far as the polarization rotation R required for generating a desired polarization distribution in the optical system results from $$R = R_{pol} + R_{sp},$$

where $R_{pol}$ designates the polarization rotation generated by the polarization-influencing optical arrangement.

3. The optical system according to claim 1, wherein the polarization-influencing optical arrangement comprises at least two polarization-influencing components.

4. The optical system according to claim 3, wherein at least two of the polarization-influencing components have different thicknesses.

5. The optical system according to claim 1, wherein the at least one polarization-influencing component comprises optically active crystal material having a crystal axis parallel to the light propagation direction.

6. The optical system according to claim 1, wherein the at least one polarization-influencing component comprises linearly birefringent crystal material having a crystal axis perpendicular to the light propagation direction.

7. The optical system according to claim 6, wherein the at least one polarization-influencing component is a lambda/4 plate.

8. The optical system according to claim 6, wherein the at least one polarization-influencing component is displaceable between a position within the optical beam path and a position outside the optical beam path, and incident light passes twice through the polarization-influencing component in the position thereof within the optical beam path during the operation of the optical system.

9. The optical system according to claim 6, wherein the at least one polarization-influencing component is a lambda/2 plate.

10. The optical system according to claim 9, wherein the at least one polarization-influencing component is displaceable between a position within the optical beam path and a position outside the optical beam path, and incident light passes once through the polarization-influencing component in the position thereof within the optical beam path during the operation of the optical system.

11. The optical system according to claim 1, wherein the deflection device is a prism, and the reflection surfaces are formed by interfaces of the prism.

12. The optical system according to claim 1, wherein the deflection device is configured so that at least one of the reflection surfaces reflects incident light during the operation of the optical system with total internal reflection.

13. The optical system according to claim 1, wherein the deflection device comprises two deflection mirrors.

14. The optical system according to claim 2, wherein the deflection device comprises two deflection mirrors.

15. The optical system according to claim 1, wherein the optical system, upstream of the polarization-influencing optical arrangement in the light propagation direction, comprises a further mirror arrangement comprising a plurality of mirror elements which are adjustable independently of one another for the purpose of changing an angular distribution of the light reflected by said mirror arrangement.

16. The optical system according to claim 15, wherein the mirror elements of the further mirror arrangement jointly form the first reflection surface.

17. The optical system according to claim 1, wherein the optical system is designed for an operating wavelength of less than 250 nm.

18. An apparatus, comprising:
    an illumination device; and
    a projection lens,
    wherein the illumination device comprises an optical system according to claim 1, and the apparatus is a microlithographic projection exposure apparatus.

19. The apparatus according to claim 18, wherein the deflection device comprises two deflection mirrors.

20. A method for microlithographically producing microstructured components, the method comprising:
    providing a substrate, to which a layer composed of a light-sensitive material is at least partly applied;
    providing a mask comprising structures to be imaged;
    providing a microlithographic projection exposure apparatus; and
    projecting at least one part of the mask onto a region of the layer with the aid of the projection exposure apparatus,
    wherein the microlithographic projection exposure apparatus comprises:
        an illumination device comprising an optical system according to claim 19; and
        a projection lens.

* * * * *

UNITED STATES PATENT AND TRADEMARK OFFICE
CERTIFICATE OF CORRECTION

| | | Page 1 of 1 |
|---|---|---|
| PATENT NO. | : 8,917,433 B2 | |
| APPLICATION NO. | : 14/103150 | |
| DATED | : December 23, 2014 | |
| INVENTOR(S) | : Ingo Saenger | |

It is certified that error appears in the above-identified patent and that said Letters Patent is hereby corrected as shown below:

In the Specification

Col. 1, line 9, after "also", insert -- claims --.

In the Claims

Col. 11, line 47, Claim 2, delete "$R\text{-}R_{pol}+R_{sp}$," and insert -- $R = R_{pol} + R_{sp}$, --.

Signed and Sealed this
Ninth Day of June, 2015

Michelle K. Lee
*Director of the United States Patent and Trademark Office*